United States Patent
Katoh

(10) Patent No.: US 10,691,040 B2
(45) Date of Patent: Jun. 23, 2020

(54) ABNORMAL DISCHARGE DETECTION CIRCUIT FOR CORONA CHARGERS

(71) Applicant: Brother Kogyo Kabushiki Kaisha, Nagoya-shi, Aichi-ken (JP)

(72) Inventor: Hiroki Katoh, Tokai (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 15/936,523

(22) Filed: Mar. 27, 2018

(65) Prior Publication Data

US 2019/0079427 A1    Mar. 14, 2019

(30) Foreign Application Priority Data

Jun. 30, 2017   (JP) .................... 2017-129806

(51) Int. Cl.
  *G03G 15/02*    (2006.01)
  *G03G 15/00*    (2006.01)
  *G01R 19/165*   (2006.01)

(52) U.S. Cl.
  CPC ..... *G03G 15/0266* (2013.01); *G03G 15/0258* (2013.01); *G03G 15/0283* (2013.01); *G03G 15/0291* (2013.01); *G03G 15/55* (2013.01); *G01R 19/16528* (2013.01); *G03G 15/5004* (2013.01); *G03G 2221/1609* (2013.01)

(58) Field of Classification Search
  CPC .......... G03G 15/0266; G03G 15/0291; G03G 15/0233; G03G 2215/027; G03G 15/80
  See application file for complete search history.

(56) References Cited

U.S. PATENT DOCUMENTS

| | | | |
|---|---|---|---|
| 7,620,335 B2 | 11/2009 | Inukai | |
| 7,986,889 B2 | 7/2011 | Hamaya | |
| 2007/0147858 A1* | 6/2007 | Inukai | G03G 15/0208 399/31 |
| 2009/0010661 A1 | 1/2009 | Hamaya | |
| 2009/0060535 A1* | 3/2009 | Hamaya | G03G 21/06 399/34 |

(Continued)

FOREIGN PATENT DOCUMENTS

| | | |
|---|---|---|
| JP | 2007-178595 A | 7/2007 |
| JP | 2009-015168 A | 1/2009 |

*Primary Examiner* — Walter L Lindsay, Jr.
*Assistant Examiner* — Jessica L Eley
(74) *Attorney, Agent, or Firm* — Banner & Witcoff, Ltd.

(57) ABSTRACT

An image forming apparatus has a photosensitive member, a plurality of corona chargers configured to charge the photosensitive member by corona discharge, a plurality of charge output circuits configured to output a charging voltage being applied to each of the corona chargers, a plurality of abnormal discharge detection circuits configured to output an abnormal discharge detection signal according to abnormal discharge occurring in each of the corona chargers, and a controller configured to have a common input port connected to the abnormal discharge detection circuits wherein the abnormal discharge detection signal output from each of the abnormal discharge detection circuits is input to the controller through the common input port. Each of the abnormal discharge detection circuits is connected to a corresponding one circuit out of the charge output circuits.

7 Claims, 7 Drawing Sheets

(56) References Cited

U.S. PATENT DOCUMENTS

2012/0051761 A1* 3/2012 Tomiyasu .......... G03G 15/0178
  399/31
2014/0079429 A1* 3/2014 Hamaya ................. G03G 15/80
  399/88

* cited by examiner

ABNORMAL DISCHARGE DETECTION CIRCUIT FOR CORONA CHARGERS

CROSS-REFERENCE TO RELATED APPLICATION

This application claims priority from Japanese Patent Application No. 2017-129806 filed on Jun. 30, 2017, the entire subject-matter of which is incorporated herein by reference.

TECHNICAL FIELD

The present disclosure relates to a technology for detecting abnormal discharge of a corona charger configured to charge a photosensitive member by corona discharge.

BACKGROUND

There has been disclosed an image forming apparatus having an abnormal discharge detection circuit for detecting abnormal discharge of corona chargers configured to charge photosensitive members. The corona chargers of the related-art image forming apparatus are disposed so as to face each of the photosensitive members, respectively. In each of the corona chargers, if a wire voltage is applied from a charging-voltage generating circuit to a charging wire, corona discharge is caused between the charging wire and a corresponding photosensitive member, whereby the surface of the corresponding photosensitive member is uniformly charged positively. The corona chargers are connected to one abnormal discharge detection circuit. The abnormal discharge detection circuit outputs an abnormal discharge detection signal to a CPU when the abnormal discharge detection circuit detects abnormal discharge occurring in any one of the corona chargers. Here, the term "abnormal discharge" includes, for example, spark discharge and arc discharge, which are different from corona discharge, caused by contamination of charging wires or the like.

In the above-mentioned image forming apparatus, the abnormal discharge detection circuit is common to the plural corona chargers, and one common signal path of the abnormal discharge detection signal to the CPU is used. Therefore, it is possible to reduce the number of input ports required for the CPU to receive the abnormal discharge detection signal. However, for example, in a printer capable of color printing, if a charging-voltage generating circuit of a corona charger corresponding to black and a charging-voltage generating circuit of corona chargers corresponding to the other colors (cyan, magenta, and yellow) are configured as separate circuits, the aspect of abnormal discharge changes. More specifically, the case where one corona charger is connected to one charging-voltage generating circuit and the case where plural corona chargers are connected to one charging-voltage generating circuit are different in outputs required for the charging-voltage generating circuit. Therefore, for example, variations of current values of abnormal discharge currents generated in the individual corona chargers are different between the above cases. Consequently, it may be impossible to accurately detect abnormal discharge occurring in each corona charger when the abnormal discharge detection circuit is configured as a common circuit between the plural corona chargers.

SUMMARY

The specification discloses an image forming apparatus capable of accurately detecting abnormal discharge while reducing the number of input ports required for a controller to receive an abnormal discharge detection signal.

One illustrative aspect provides an image forming apparatus including:

a photosensitive member; a plurality of corona chargers configured to charge the photosensitive member by corona discharge;

a plurality of charge output circuits configured to output a charging voltage being applied to each of the corona chargers;

a plurality of abnormal discharge detection circuits configured to output an abnormal discharge detection signal according to abnormal discharge occurring in each of the corona chargers; and a controller configured to have a common input port connected to the abnormal discharge detection circuits wherein the abnormal discharge detection signal output from each of the abnormal discharge detection circuits is input to the controller through the common input port, wherein each of the abnormal discharge detection circuits is connected to a corresponding one circuit out of the charge output circuits.

According to the image forming apparatus, the abnormal discharge detection circuits configured to output the abnormal discharge detection signals according to abnormal discharge occurring in the corona chargers are connected to the charge output circuits, respectively. The controller has the common input port connected to the abnormal discharge detection circuits such that each of the abnormal discharge detection signals is input from each of the abnormal discharge detection circuits to the common input port. According to this configuration, it is possible to reduce the number of input ports required for the controller to receive the abnormal discharge detection signals. Since the individual abnormal discharge detection circuits are connected to the charge output circuits, respectively, it is possible to change a circuit constant and the like of each of the abnormal discharge detection circuits to other values. Therefore, it is possible to optimize conditions for outputting the abnormal discharge detection signals, i.e. sensitivities for detecting abnormal discharge, according to the characteristics of abnormal discharge occurring in the individual corona chargers (the output capacities and the like of the individual charge output circuits). As a result, it is possible to accurately detect abnormal discharge while reducing the number of input ports required for the controller to receive the abnormal discharge detection signals.

DETAILED DESCRIPTION

First Illustrative Embodiment

Figure 1:
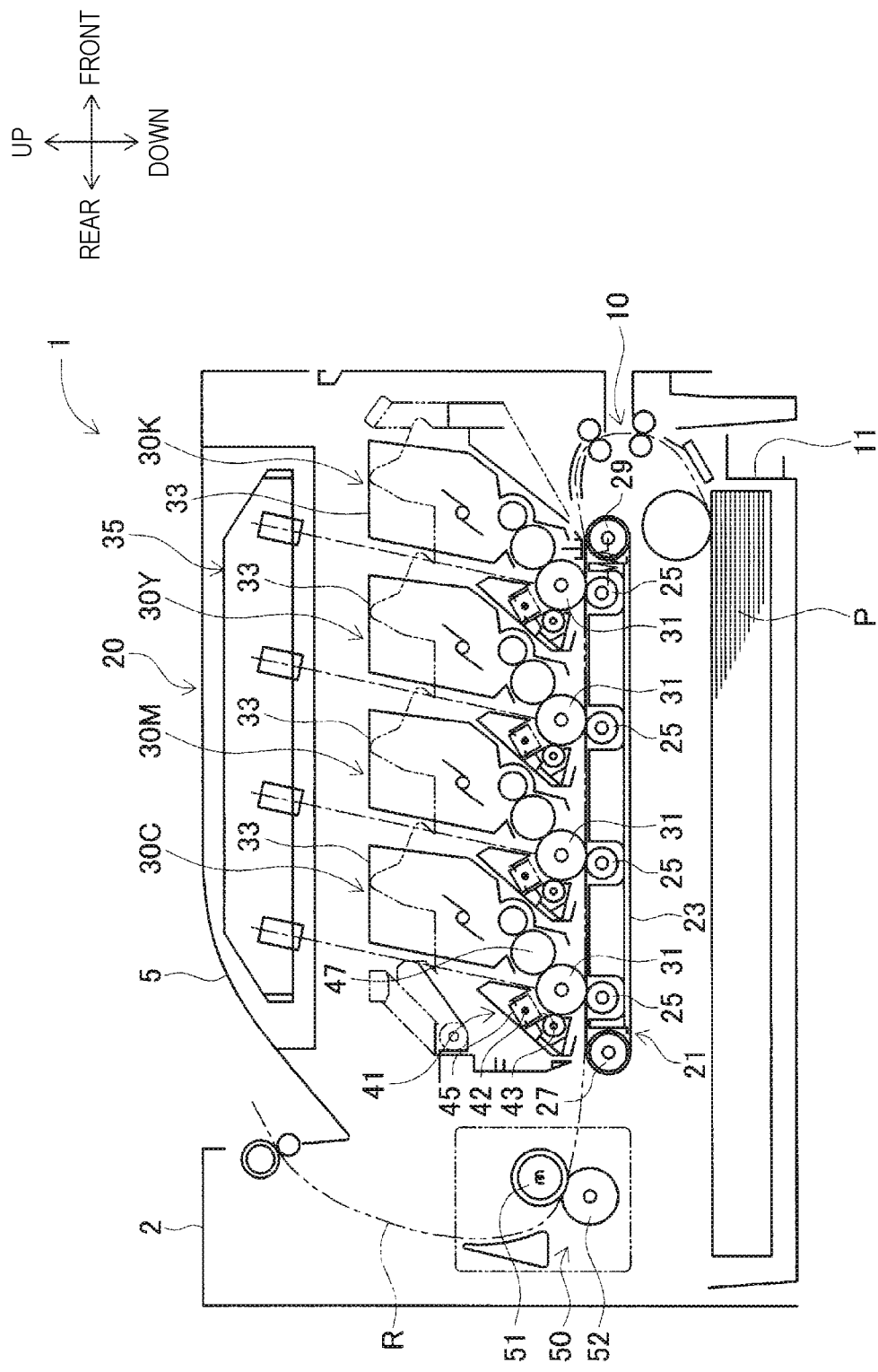
FIG. 1 is a cross-sectional view illustrating a configuration of a color laser printer of a first illustrative embodiment.

Hereinafter, a first illustrative embodiment of the present disclosure will be described with reference to the accompanying drawings. A laser printer 1 shown in FIG. 1 is a first illustrative embodiment of an image forming apparatus according to the present disclosure, and is a so-called tandem type color laser printer for forming color images on media such as sheets P with toner of four colors in an electrophotographic manner. In the following description, as shown in FIG. 1, the left side and right side of the drawing sheet are defined as the front side and rear side of the laser printer 1, respectively. Hereinafter, the laser printer 1 will be referred to simply as the printer 1. Further, a direction toward a viewer of FIG. 1 and a direction away from the viewer of FIG. 1 are defined as the left side and right side of the printer 1 as seen from the front side of the printer 1, respectively. Furthermore, the upper side and lower side of the drawing sheet of FIG. 1 are defined as the upper side and lower side of the printer 1.

As shown in FIG. 1, the printer 1 includes a main body housing 2 having a box-like shape, and includes a paper feeding unit 10, an image forming unit 20, and so on stored in the main body housing 2. The main body housing 2 has a paper discharge tray 5 provided on the top for storing sheets P subjected to image formation in a stack. The paper feeding unit 10 includes a paper feed tray 11 for storing sheets P, and various rollers, and feeds sheets P to the image forming unit 20 by driving the various rollers. The paper feed tray 11 is configured to be attachable to and removable from the lower part of the main body housing 2.

The image forming unit 20 includes a conveying unit 21, four process cartridges 30C, 30M, 30Y, and 30K, an exposing unit 35, and a fixing unit 50. The conveying unit 21 is installed between the paper feeding unit 10 and the process cartridges such as the process cartridge 30C in the vertical direction, and includes a conveying belt 23, four transfer rollers 25, and so on. The conveying belt 23 is an endless belt which is a ring-shaped belt, and is wound on a driving roller 27 positioned below the rear end side of the image forming unit 20 and a driven roller 29 positioned below the front side of the image forming unit. The upper surface of the conveying belt 23 extends substantially in the horizontal direction directly below the process cartridges such as the process cartridge 30C, and comes into contact with the rear surface of each sheet P fed by the paper feeding unit 10. The driving roller 27 rotates the conveying belt 23 in a predetermined direction. When a transfer bias is applied to each transfer roller 25, the conveying belt 23 is charged negatively, and attracts each sheet P to the upper surface with an electrostatic force while conveying the attracted sheet P toward the paper discharge tray 5 along a conveyance path R.

The process cartridges 30C, 30M, 30Y, and 30K correspond to four colors, i.e. cyan (C), magenta (M), yellow (Y), and black (K), respectively. The process cartridges such as the process cartridge 30C contain toner of the corresponding colors (C, M, Y, and K), respectively. The four process cartridges such as the process cartridge 30C are installed from the front side of the printer 1 toward the rear side in the order of the process cartridges 30K, 30Y, 30M, and 30C.

The process cartridge 30C includes a photosensitive member 31, a corona charger 41, a toner cartridge 33, and so on. The other process cartridges 30M, 30Y, and 30K have the same configuration as that of the process cartridge 30C except that they have different toner colors. For this reason, hereinafter, the process cartridge 30C will be described as a representative, and a description of the other process cartridges 30M, 30Y, and 30K will be appropriately omitted.

The photosensitive member 31 is positioned on a transfer roller 25 with the conveying belt 23 interposed between the photosensitive member 31 and the transfer roller 25 in the vertical direction. The corona charger 41 is, for example, a scorotron type corona charger configured by storing a charging wire 42 and a grid 43 in a shield case 45. The charging wire 42 is made of a metal, for example, gold-plated tungsten or tungsten. The shield case 45 is formed almost in a square tube shape long in the left-right direction. A part of the shield case 45 facing the photosensitive member 31 has an opening. The grid 43 is configured by tightly stretching a conductive line material in a mesh over the opening of the shield case 45. The charging wire 42 is tightly stretched in the left-right direction inside the shield case 45, and is disposed at a position in an upper part of the rear side from the photosensitive member 31, with a gap from the photosensitive member 31. Therefore, the grid 43 is disposed between the photosensitive member 31 and the charging wire 42.

The corona charger 41 uniformly charges the surface of the photosensitive member 31 positively when an image formation is performed. Specifically, when voltages are applied to the charging wire 42 and the grid 43, between the charging wire 42 and the photosensitive member 31, an electric field is produced and corona discharge occurs. When an electric field is produced between the charging wire 42 and the grid 43, a voltage different from a voltage which is applied to the charging wire 42 is applied to the grid 43, whereby the intensity of the electric field is controlled and the charge amount of the photosensitive member 31 is controlled.

The exposing unit 35 is installed on the uppermost side of the inside of the main body housing 2, and forms electrostatic latent images based on image data on the charged surfaces of the individual photosensitive members 31. The toner cartridges 33 feed the contained toner onto the surfaces of developing rollers 47, such that the developing rollers feed the toner onto the surfaces of the photosensitive members 31. The toner is fed to the electrostatic latent images formed on the surfaces of the photosensitive members 31, whereby toner images are formed. While the conveying unit 21 conveys a sheet P toward the fixing unit 50, a transfer bias is applied to the transfer rollers 25, whereby the toner images formed on the surfaces of the photosensitive members 31 are transferred onto the sheet P.

The fixing unit 50 is installed on the downstream side from the conveying unit 21 on the conveyance path R. The fixing unit 50 includes a heating roller 51 and a pressing roller 52. The heating roller 51 is installed so as to face the image formation surface of each sheet P, and rotates in sync with the conveying belt 23 and so on, thereby conveying each sheet P, while heating toner transferred on the corresponding sheet P. The pressing roller 52 presses each sheet P against the heating roller 51 with the corresponding sheet P interposed therebetween while being rotated with rotation of the heating roller 51. In this way, the fixing unit 50 melts toner transferred on each sheet P by heating, thereby fixing the toner, while conveying the corresponding sheet P along the conveyance path R.

Figure 2:
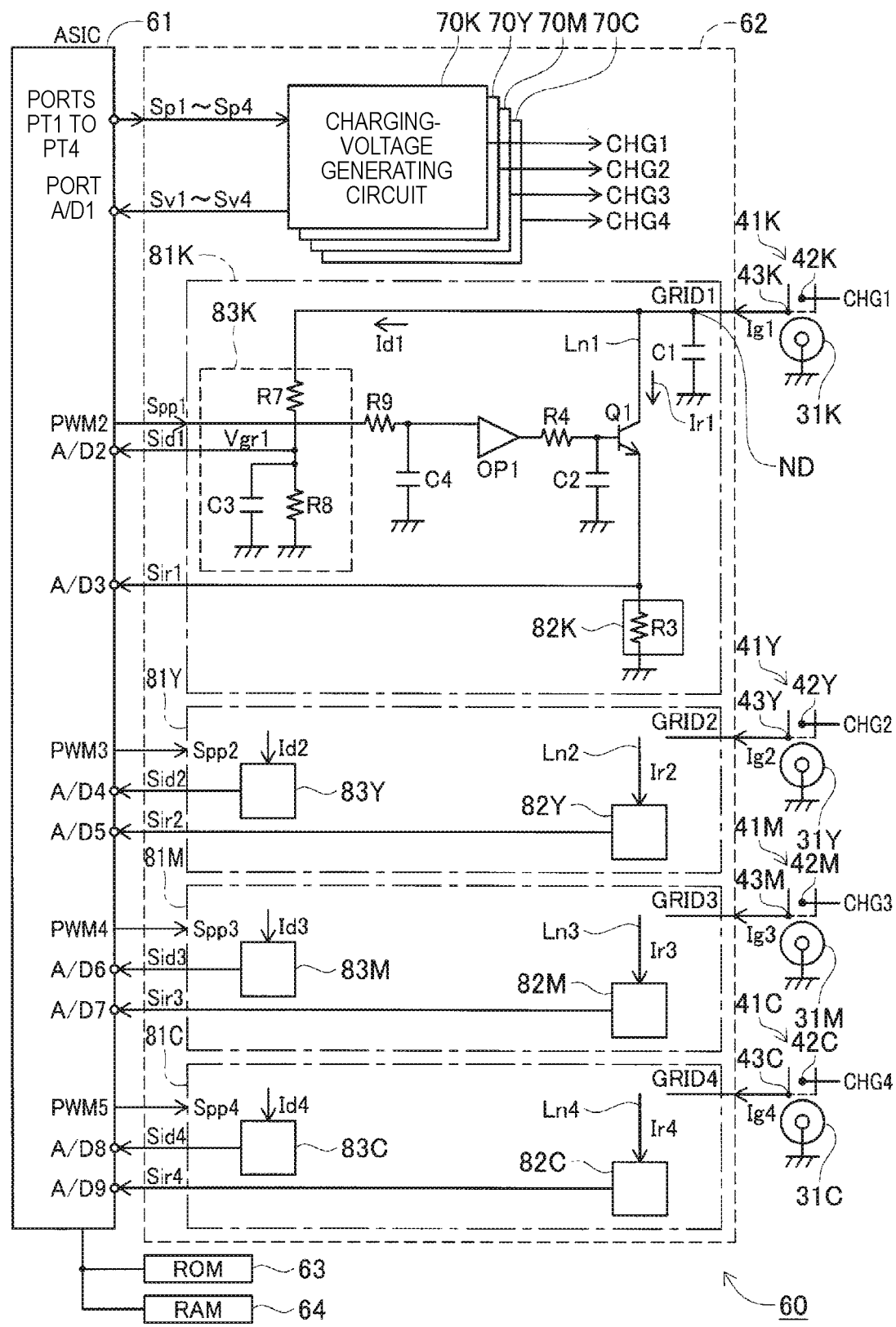
FIG. 2 is a circuit diagram related to a high-voltage power supply device of the printer.

Now, with reference to FIG. 2, electrical configurations of the printer 1 related to the present disclosure will be described. FIG. 2 shows a circuit diagram of a high-voltage power supply device 60 mounted on a circuit board (not shown in the drawings) which is installed inside the printer 1, and connection configurations related to the high-voltage power supply device 60. In the following description, in the case where components for the individual colors need to be distinguished, additional characters of Y (yellow), M (magenta), C (cyan), and K (black), or additional characters such as 1 to 4 (for example, grid voltages GRID1 to GRID4) are attached to the reference symbols of the corresponding components, whereas in the case where components for the individual colors do not need to be distinguished, the additional characters are omitted (for example, grid voltages GRID).

The high-voltage power supply device 60 includes an ASIC (Application Specific IC) 61, and a high-voltage power supply circuit 62, a ROM 63, and a RAM 64 connected to the ASIC 61. The ASIC 61 (an example of a controller) controls the high-voltage power supply circuit 62, and also generally controls the whole of the printer 1. The ROM 63 is a storage medium for storing various operation programs to be executed by the ASIC 61, and so on. The RAM 64 stores temporary data of various processes, image data for printing processes, and so on.

The high-voltage power supply circuit 62 includes a plurality of charging-voltage generating circuits 70 corresponding to the individual colors, and grid voltage adjustment circuits 81 including grid current detection circuits 82. Four charging-voltage generating circuits 70 (charging-voltage generating circuits 70K, 70Y, 70M, and 70C) are installed corresponding to the individual colors. The charging-voltage generating circuits 70K, 70Y, 70M, and 70C are connected in this order to ports PT1 to PT4 of the ASIC 61, respectively. To the charging-voltage generating circuits 70K to 70C, PWM (Pulse Width Modulation) signals Sp1 to Sp4 are supplied from the ASIC 61 via the ports PT1 to PT4, respectively. The charging-voltage generating circuits 70K to 70C are connected to the corona chargers 41 (41K to 41C) configured to charge the photosensitive members 31 of the individual colors, respectively. The four charging-voltage generating circuits 70 apply wire voltages CHG1 to CHG4 to the corona chargers 41, respectively. The charging-voltage generating circuits 70 can control the voltage values of the wire voltages CHG1 to CHG4 according to the duty ratios of the PWM signals Sp1 to Sp4, respectively. For example, as the duty ratio of the PWM signal Sp1 increases, the voltage value of the wire voltage CHG1 gradually increases. The detailed configurations of the charging-voltage generating circuits 70 will be described below.

The grid voltage adjustment circuits 81K to 81C and the grid current detection circuits 82K to 82C are provided corresponding to the corona chargers 41K to 41C, respectively. The grid voltages GRID1 to GRID4 to be applied to the grids 43 are adjusted by the grid voltage adjustment circuits 81K to 81C, respectively. The wire voltages CHG are, for example, about 5.5 kV to 7 kV. The grid voltages GRID are, for example, about 700 V.

Each of the grid voltage adjustment circuits 81 includes a voltage detection circuit 83 and an operational amplifier OP1. Since the grid voltage adjustment circuits 81K to 81C have the same circuit configuration, in the following description, the grid voltage control circuit 81K corresponding to black (K) will be described, and a description of the other grid voltage adjustment circuits 81Y to 81C will be appropriately omitted. The voltage detection circuit 83K includes two voltage division resistors R7 and R8 connected in series. In the voltage division resistors R7 and R8, a shunt current Id1 of a grid current Ig1 flowing in the grid 43K flows. The voltage detection circuit 83K outputs a detection voltage Vgr1 according to the grid voltage GRID1 applied to the grid 43K, from the connection point of the two voltage division resistors R7 and R8. The voltage detection circuit 83K supplies the detection voltage Vgr1 as a divided-voltage detection signal Sid1 to a port A/D2 of the ASIC 61. A capacitor C3 is connected in parallel to the voltage division resistor R8, whereby a RC filter is configured.

The operational amplifier OP1 is connected to a port PWM2 of the ASIC 61 via an output resistor R9. The output resistor R9 is connected to a ground via a capacitor C4. The ASIC 61 outputs a PWM signal Spp1 from the port PWM2 such that the PWM signal Spp1 is supplied to the operational amplifier OP1 via the output resistor R9. Therefore, the ASIC 61 is configured to change a reference voltage for the operational amplifier OP1, and so on.

An output terminal of the operational amplifier OP1 is connected to a smoothing circuit including a voltage division resistor R4 and a capacitor C2. A connection point of the voltage division resistor R4 on the side close to the grid 43K (the side opposite to the output terminal of the operational amplifier OP1) is connected to the ground via the capacitor C2. To the connection point of the voltage division resistor R4 on the side close to the grid 43K, the base of a transistor Q1 for stabilizing the grid voltage GRID1 is connected. Further, the transistor Q1 is connected to a voltage control line Ln1 connected to the connection point of the voltage division resistor R7 and the grid 43K. The transistor Q1 is, for example, an NPN transistor, and its collector is connected to the connection point (the voltage control line Ln1) on the close to the grid 43K, and its emitter is connected to the grid current detection circuit 82K (the resistor R3). However, the transistor Q1 is not limited to a bipolar transistor, and may be, for example, a field-effect transistor (FET).

The base current of the transistor Q1 is controlled by the output of the operational amplifier OP1. The transistor Q1 functions as a variable resistor since the collector resistance varies according to the magnitude of the base current. Here, the collector resistance is a resistance value obtained by dividing the voltage between the collector and the emitter by the collector current. For example, as the base current increases, the resistance value decreases, and as the base current decreases, the resistance value increases. As a result, the voltage between the collector and the emitter changes.

The ASIC 61 perform feedback control based on the detection voltage Vgr1 detected by the voltage detection circuit 83K. The ASIC 61 changes the PWM signal Spp1, thereby changing the base current of the transistor Q1 and changing the grid voltage GRID1. Therefore, the ASIC 61 changes the duty ratio of the PWM signal Spp1, thereby capable of changing the voltage value of the grid voltage GRID1 to a predetermined target voltage value. Between the voltage control line Ln1 and the grid 43K, a capacitor C1 is provided to be charged with the grid voltage GRID.

The voltage control line Ln1 is connected to the grid current detection circuit 82K configured to detect a line current Ir1 according to the grid current Ig1 flowing in the grid 43K. The resistor R3 of the grid current detection circuit 82K is connected between the emitter of the transistor Q1 and the ground. The grid current detection circuit 82K supplies the voltage of a positive terminal of the resistor R3 as a line voltage detection signal Sir1 to a port A/D3 of the ASIC 61.

The ASIC 61 controls the voltage value of the wire voltage CHG1 to be supplied from the charging-voltage generating circuit 70, on the basis of the current value of the grid current Ig1 (the line voltage detection signal Sir1). Similarly, the ASIC 61 controls the voltage values of the wire voltages CHG2 to CHG4 of the charging-voltage generating circuits 70Y to 70C, on the basis of grid currents Ir2 to Ir4 (line voltage detection signals Sir2 to Sir4) of the other colors.

For example, the ASIC 61 calculates the line current Ir1 (the grid current Ig1) from the resistance value of the resistor R3 and the voltage value of the line voltage detection signal Sir1. The ASIC 61 controls the charging-voltage generating circuit 70K on the basis of the current value of the calculated grid current Ig1, such that the current value of the grid current Ig1 becomes equal to a desired target current value. The ASIC 61 changes the duty ratio of the PWM signal Sp1 to be output from the port PT1, such that the current value of the grid current Ig1 becomes equal to the desired target current value. Similarly, the ASIC 61 changes the duty ratios of the PWM signals Sp2 to Sp4 to be output from the other ports PT2 to PT4, such that the current values of the grid currents Ir2 to Ir4 become equal to desired target current values.

(Configurations of the Charging-Voltage Generating Circuits 70)

Now, the circuit configurations of the charging-voltage generating circuits 70 will be described. Although the four charging-voltage generating circuits 70K to 70C of the present illustrative embodiment may be different in circuit constants (such as resistance values, electrostatic capacitance values, and the ratios of turns of windings of transformers) or output capacities, they have the same circuit configuration. For this reason, in the following description, the charging-voltage generating circuit 70K corresponding to black (K) will be mainly described, and a detailed description of the other charging-voltage generating circuits 70Y to 70C will not be made.

Figure 3:
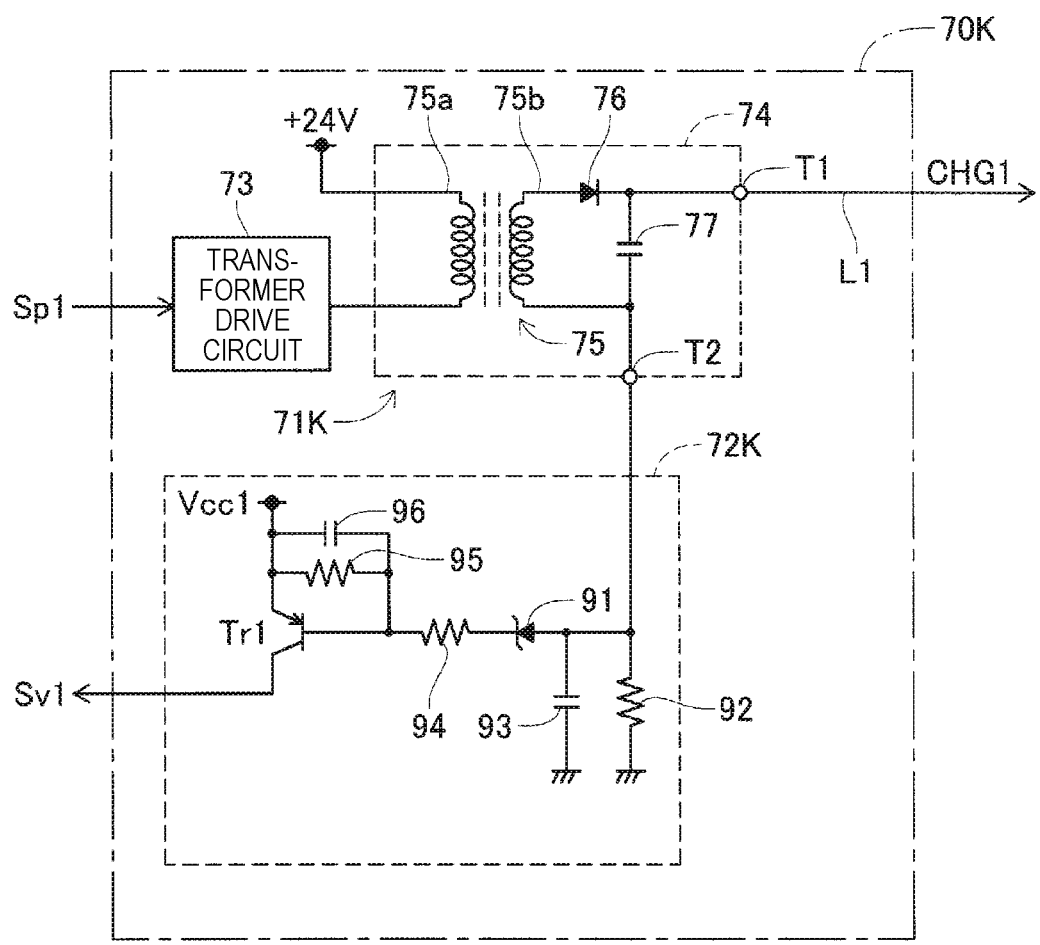
FIG. 3 is a circuit diagram of a charging-voltage generating circuit.

As shown in FIG. 3, the charging-voltage generating circuit 70K includes a charging-voltage output circuit 71K and an abnormal discharge detection circuit 72K. The charging-voltage output circuit 71K (an example of charge output circuits) includes a transformer drive circuit 73 and a boosting circuit 74. The charging-voltage output circuit 71K generates the wire voltage CHG1 to be applied to the charging wire 42K of the corona charger 41K (see FIG. 2).

The transformer drive circuit 73 receives the PWM signal Sp1 from the port PT1 of the ASIC 61, and smoothes the PWM signal Sp1. The transformer drive circuit 73 supplies the PWM signal Sp1 subjected to smoothing, to a transistor for drive (not shown in the drawings), thereby driving the transistor for drive, thereby supplying an oscillation current to a primary winding 75a of the boosting circuit 74. The boosting circuit 74 includes a transformer 75, a rectifier diode 76, and a smoothing capacitor 77. To the primary winding 75a of the transformer 75, a DC power supply (24 V) is connected. According to the duty ratio of the oscillation current supplied from the transformer drive circuit 73, the transformer 75 can change the voltage value of the output voltage (the wire voltage CHG1) to be output from a secondary winding 75b. For example, as the duty ratio of the PWM signal Sp1 increases, the transformer 75 generates a wire voltage CHG1 having a larger voltage value. To the secondary winding 75b, the rectifier diode 76 and the smoothing capacitor 77 are connected.

According to this configuration, the voltage generated in the primary winding 75a is boosted in the secondary winding 75b, and then is rectified and smoothed by the rectifier diode 76 and the smoothing capacitor 77, thereby becoming the wire voltage CHG1. The wire voltage CHG1 is applied from the boosting circuit 74 to the charging wire 42K of the corona charger 41K via a high-voltage-side output terminal T1 of the boosting circuit 74 and a power line L1. When the wire voltage CHG1 is applied to the charging wire 42K, between the charging wire 42K and the photosensitive member 31K, corona discharge occurs. With this corona discharge, in the grid 43K, the grid voltage GRID1 is generated.

The abnormal discharge detection circuit 72K is disposed between a low-voltage-side output terminal T2 of the boosting circuit 74 and the ground. The low-voltage-side output terminal T2 is connected to the low voltage side of the secondary winding 75b of the transformer 75. When abnormal discharge occurs in the corona charger 41K, an abnormal discharge current instantaneously flows via the grid 43K and the ground. By detecting such a current, the abnormal discharge detection circuit 72K detects whether abnormal discharge has occurred. The term "abnormal discharge" include, for example, spark discharge and arc discharge which are different from corona discharge and are caused by contamination of charging wires by toner or paper powder.

In the case of a normal operation, when the wire voltage CHG1 is applied from the high voltage side of the secondary winding 75b of the transformer 75 to the corona charger 41K, the grid current Ig1 (see FIG. 2) flowing in the grid 43K flows to the ground, for example, via the grid current detection circuit 82K (see FIG. 2). When abnormal discharge occurs in the corona charger 41K, for example, a part of the abnormal discharge current flows from the grid current detection circuit 82K to the abnormal discharge detection circuit 72K via the ground, and returns from the low-voltage-side output terminal T2 to the low voltage side of the secondary winding 75b of the transformer 75. When such an abnormal discharge current returning via the ground becomes equal to or higher than a predetermined current value, the abnormal discharge detection circuit 72K outputs an abnormal discharge detection signal Sv1 representing occurrence of abnormal discharge.

The abnormal discharge detection circuit 72K includes, for example, a zener diode 91, a detection resistor 92, a capacitor 93, a transistor Tr1, resistors 94 and 95, and a capacitor 96. The positive terminals of the detection resistor 92 and the capacitor 93 are connected to the low-voltage-side output terminal T2 of the boosting circuit 74. The negative terminals of the detection resistor 92 and the capacitor 93 are connected to the ground. The detection resistor 92 and the capacitor 93 smooth an abnormal discharge current returning via the ground. The positive terminals of the detection resistor 92 and the capacitor 93 are connected to the anode of the zener diode 91.

The transistor Tr1 is, for example, a PNP transistor, and the emitter is connected to a DC power supply Vcc1. The voltage of the DC power supply Vcc1 is, for example, 5.0 V. To the base of the transistor Tr1, the cathode of the zener diode 91 is connected via the resistor 94. The resistor 95 is connected between the emitter of the transistor Tr1 and a terminal of the resistor 94 close to the base of the transistor Tr1. Similarly, the capacitor 96 is connected between the emitter of the transistor Tr1 and the terminal of the resistor 94 close to the base. The circuit configuration of the abnormal discharge detection circuit 72K of the present illustrative embodiment is an example, and can be appropriately modified. For example, the abnormal discharge detection circuit 72K may not include the capacitor 96. The transistor Tr1 is not limited to a bipolar transistor, and may be, for example, a field-effect transistor (FET).

For example, when spark discharge occurs between the charging wire 42K and the grid 43K, an abnormal discharge current flowing in the grid 43K changes significantly at intervals. A part of the abnormal discharge current flows to the detection resistor 92 via the ground, whereby the voltage of the positive terminal of the detection resistor 92 lowers. When the voltage of the positive terminal of the detection resistor 92 lowers to the zener voltage (breakdown voltage) of the zener diode 91, a base current suddenly flows in the base of the transistor Tr1. Further, when an abnormal discharge current equal to or higher than the predetermined current value (spark discharge) occurs, the transistor Tr1 is turned on. When the transistor Tr1 is turned on, a current flows between the emitter and collector of the transistor Tr1, and the abnormal discharge detection signal Sv1 according to the voltage value of the DC power supply Vcc1 is output from the collector.

Figure 4:
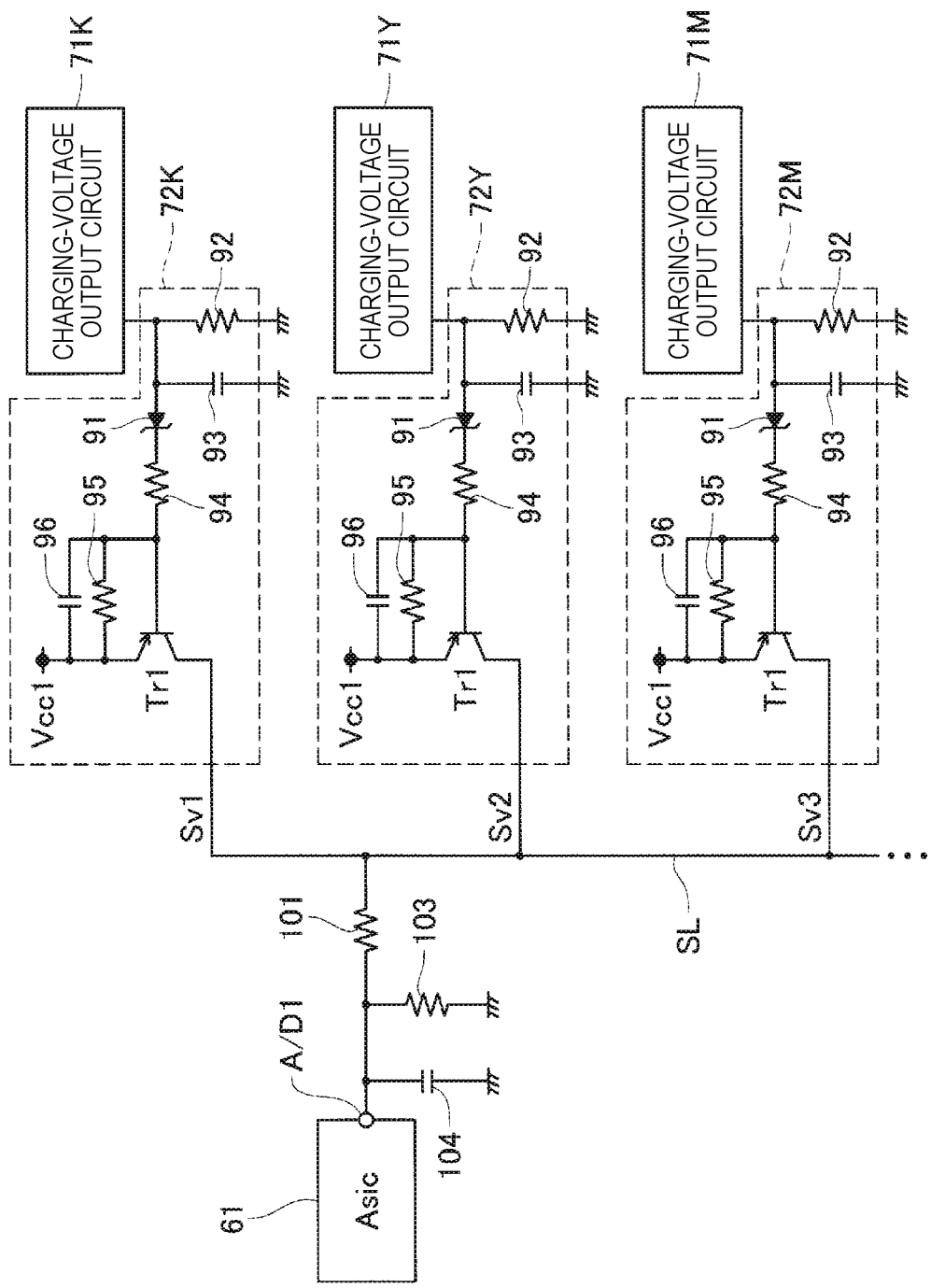
FIG. 4 is a circuit diagram illustrating the connection relation of an ASIC, abnormal discharge detection circuits, and charging-voltage generating circuits according to the first illustrative embodiment.

FIG. 4 shows the connection relation between the abnormal discharge detection circuits 72 and the ASIC 61. However, in FIG. 4, in order to prevent the drawing from becoming complicated, the charging-voltage output circuit 71C corresponding to cyan is omitted. As shown in FIG. 4, each of the four abnormal discharge detection circuits 72 is connected to a common signal line SL which is a shared signal line. The collector of the transistor Tr1 of each abnormal discharge detection circuit 72 is connected to a port A/D1 of the ASIC 61 via the common signal line SL. Therefore, although the charging-voltage generating circuits 70 are provided corresponding to the individual colors, the charging-voltage generating circuits 70 (the abnormal discharge detection circuits 72) output abnormal discharge detection signals Sv1 to Sv4 to a common signal path.

The ASIC 61 of the present illustrative embodiment is configured to have the port A/D1 (an example of a common input port) connected to the four abnormal discharge detection circuits 72 such that the abnormal discharge detection signals Sv1 to Sv4 output from the individual abnormal discharge detection circuits 72 are input to the ASIC 61 through the port A/D1. Further, each of the abnormal discharge detection circuits 72 is connected to a corresponding one of the charging-voltage output circuits 71K to 71C (examples of the charge output circuits), that is different between the abnormal discharge detection circuits 72. That is, the charging-voltage output circuits 71, which are connected to the different corresponding abnormal discharge detection circuit 72, are different from each other. In the example shown in FIG. 4, the abnormal discharge detection circuit 72K is connected to the charging-voltage output circuit 71K, the abnormal discharge detection circuit 72Y is connected to the charging-voltage output circuit 71Y, and the abnormal discharge detection circuit 72M is connected to the charging-voltage output circuit 71M. The charging-voltage output circuits 71K, 71Y, 71M are different from each other.

Between the common signal line SL and the ASIC 61, a detection resistor 101 for detecting the abnormal discharge detection signals Sv is connected. To a terminal of the detection resistor 101 close to the ASIC 61, a resistor 103 and a capacitor 104 are connected. One end of each of the resistor 103 and the capacitor 104 is connected to the detection resistor 101 (the port A/D1 of the ASIC 61), and the other end is connected to the ground. The resistor 103 and the capacitor 104 smooth each abnormal discharge detection signal Sv detected by the detection resistor 101.

Normally, the transistors Tr1 are in an OFF state. Therefore, any abnormal discharge detection signal Sv is not output from the collectors of the transistors Tr1. When abnormal discharge occurs, a corresponding transistor Tr1 is turned on. Therefore, an abnormal discharge detection signal Sv is input from the corresponding transistor Tr1 to the ASIC 61. On the basis of the abnormal discharge detection signal Sv input from the port A/D1, the ASIC 61 can detect whether abnormal discharge has occurred. When detecting abnormal discharge, the ASIC 61 performs a predetermined process such as a process of notifying a user that abnormal discharge has occurred and urging the user to clean the charging wires.

Here, the ON/OFF characteristic of the transistor Tr1 of each abnormal discharge detection circuit 72, i.e. the characteristic (sensitivity) for discharging the abnormal discharge detection signals Sv according to the level of abnormal discharge (the magnitude of an abnormal discharge current) can be changed by changing circuit constants and the like of the corresponding abnormal discharge detection circuit 72. For example, the zener diode 91 may be replaced with another one having a different zener voltage (breakdown voltage). The resistors 94 and 95 and the capacitor 96 may be replaced with others having different resistance values and a different electrostatic capacitance value. Alternatively, the transistor Tr1 may be replaced with another one having a different I-V characteristic.

For example, in the case where the connection path between the detection resistor 92 of an abnormal discharge detection circuit 72 and a corresponding corona charger 41 via the ground is long, and thus attenuation of an abnormal discharge current in the path from the corona charger 41 to the detection resistor 92 is significant, it is required to make the sensitivity of the corresponding abnormal discharge detection circuit higher than those of the other abnormal discharge detection circuits 72. In the case where it is required to increase the sensitivity of an abnormal discharge detection circuit 72, for example, the absolute value of the zener voltage (breakdown voltage) of the zener diode 91 is decreased and the transistor Tr1 is configured to be more likely to be turned on (to be turned on by an abnormal discharge current having a smaller current value), such that the sensitivity increases. Conversely, in the case where it is required to decrease the sensitivity of an abnormal discharge detection circuit 72, for example, the absolute value of the zener voltage of the zener diode 91 is increased and the transistor Tr1 is configured to be more unlikely to be turned on (to be turned on by an abnormal discharge current having a larger current value), such that the sensitivity decreases. By adjusting the sensitivities of the individual abnormal discharge detection circuits 72 as described above, it is possible to equalize the sensitivities for abnormal discharge and improve the detection accuracy. However, adjusting high sensitivity of an abnormal discharge detection circuit 72 to lower sensitivity decreases the sensitivity of the whole device. For this reason, it is preferable that sensitivity adjustment be performed on abnormal discharge detection circuits 72 having low sensitivities, thereby increasing the sensitivities.

Meanwhile, the four abnormal discharge detection circuits 72 of the present illustrative embodiment are formed in the same circuit configuration. While forming the abnormal discharge detection circuits 72 in the same circuit configuration, it is possible to adjust their sensitivities by changing circuit constants and the like. Therefore, it is possible to individually change the sensitivity of each abnormal discharge detection circuit 72 while reducing the manufacturing cost.

In this connection, the printer 1 is an example of the image forming apparatus. The ASIC 61 is an example of the controller. The charging-voltage output circuits 71 are examples of the charge output circuits. The port A/D1 is an example of the common input port. The wire voltages CHG are examples of the charging voltage.

According to the first illustrative embodiment described above, the following effects are obtained.

(1) The printer 1 (the image forming apparatus) of the first illustrative embodiment includes the photosensitive member 31, the plurality of corona chargers 41 configured to charge the photosensitive member 31 by corona discharge, the plurality of charging-voltage output circuits 71 (the charge output circuits) configured to output the wire voltage CHG (the charging voltage) being applied to each of the corona chargers 41, the plurality of abnormal discharge detection circuits 72 configured to output the abnormal discharge detection signal Sv according to abnormal discharge occurring in each of the corona chargers 41, and the ASIC 61 (the controller) configured to have the port A/D1 (the common input port) connected to the abnormal discharge detection circuits 72 wherein the abnormal discharge detection signal Sv output from each of the abnormal discharge detection circuits 72 is input to the ASIC 61 through the port A/D1. Each of the abnormal discharge detection circuits 72 is connected to a corresponding one circuit out of the charging-voltage output circuits 71, which is different from the abnormal discharge detection circuits 72.

According to this configuration, the abnormal discharge detection circuits 72 configured to output the abnormal discharge detection signals Sv according to abnormal discharge occurring in the corona chargers 41 are connected to the charging-voltage output circuits 71 (the charge output circuits), respectively. The ASIC 61 has the port A/D1 (the common input port) connected to the abnormal discharge detection circuits 72 such that the abnormal discharge detection signals Sv1 to Sv4 are input from the individual abnormal discharge detection circuits 72 to the port A/D1. Therefore, it is possible to reduce the number of input ports required for the ASIC 61 to receive the abnormal discharge detection signals Sv1 to Sv4. Since the individual abnormal discharge detection circuits 72 are connected to the individual charging-voltage output circuits 71, respectively, it is possible to change circuit constants and the like of each abnormal discharge detection circuit 72 to other values. Therefore, it is possible to optimize conditions for outputting the abnormal discharge detection signals Sv, i.e. the sensitivities for detecting abnormal discharge, according to the characteristics of abnormal discharge occurring in the individual corona chargers 41, the connection configurations, and so on. As a result, it is possible to accurately detect abnormal discharge while reducing the number of input ports required for the ASIC 61 to receive the abnormal discharge detection signals Sv1 to Sv4.

(2) Each of the corona chargers 41 includes a charging wire 42, and a grid 43 disposed between the photosensitive member 31 and the charging wire 42. At least one of the charging-voltage output circuits 71 (the charge output circuits) is connected to a charging wire 42 provided in each of the corona chargers 41, and applies a wire voltage CHG (a charging voltage) to the charging wire 42.

When the charge output circuits (for example, the grid voltage adjustment circuits 81) of the present disclosure are connected to the grids 43, and the abnormal discharge detection circuits 72 are connected to the grids 43 (see FIG. 6), the possibility that abnormal discharge currents do not flow in the grids 43 and it is impossible to detect abnormal discharge increases. Meanwhile, in the case where the charging-voltage output circuits 71 (the charge output circuits) are connected to the charging wires 42, and the abnormal discharge detection circuits 72 are connected to the charging wires 42 (the first illustrative embodiment), even though any abnormal discharge current does not flow on the side close to the grids 43, for example, when an abnormal discharge detection circuit flows on the side close to the charging wires 42 and returns to an abnormal discharge detection circuit 72 via the ground, it becomes possible to detect abnormal discharge. Therefore, according to the configuration in which the abnormal discharge detection circuits 72 are provided close to the charging wires 42, it becomes possible to further improve the accuracy of detection of abnormal discharge as compared to the configuration in which the abnormal discharge detection circuits 72 are provided close to the grid 43.

Second Illustrative Embodiment

Figure 5:
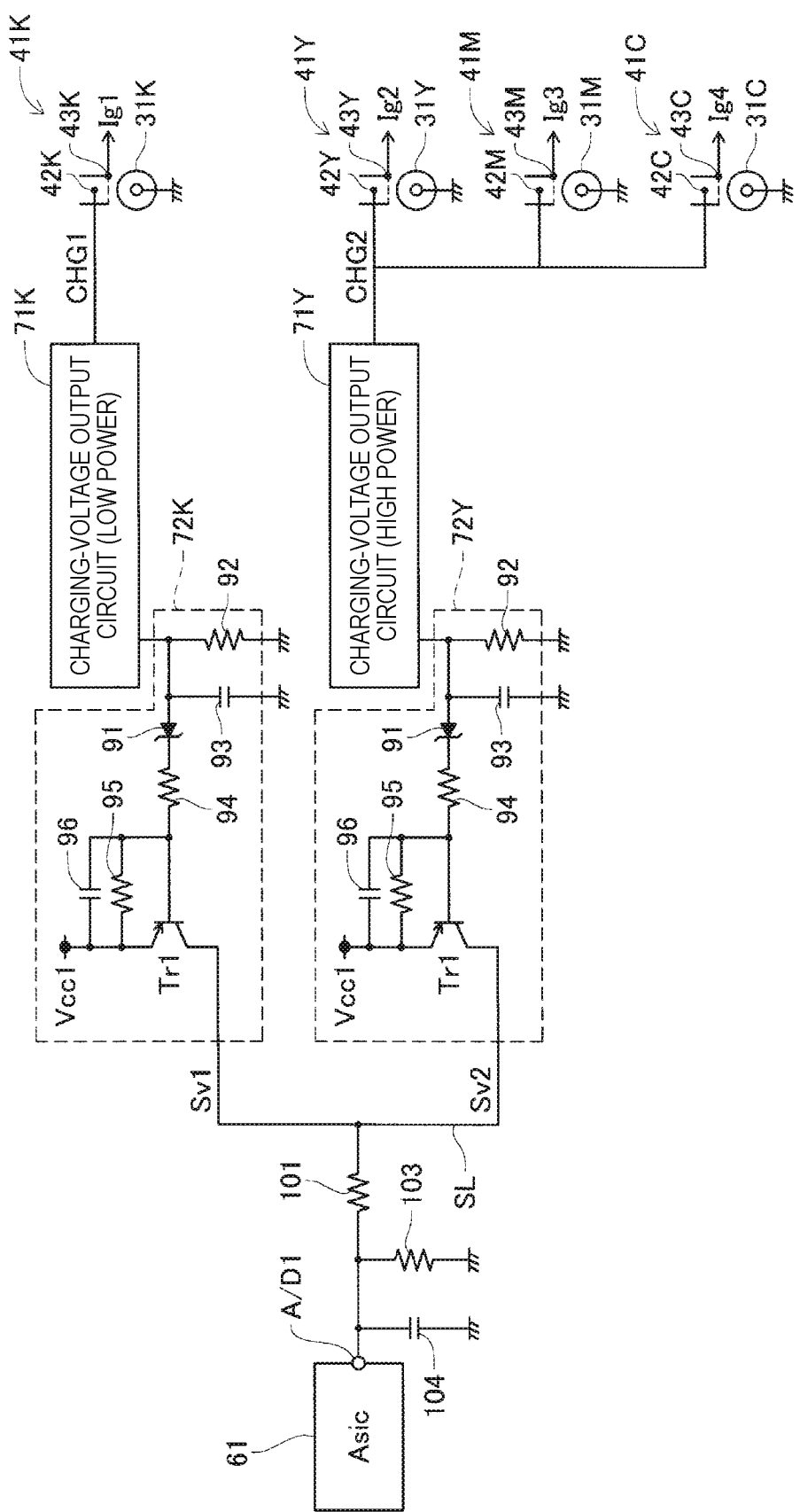
FIG. 5 is a circuit diagram illustrating the connection relation of an ASIC, abnormal discharge detection circuits, and charging-voltage generating circuits according to a second illustrative embodiment.

Now, the configuration of a second illustrative embodiment will be described with reference to FIG. 5. In the first illustrative embodiment described above, one corona charger 41 is connected to one charging-voltage output circuit 71 such that a wire voltage CHG is supplied to the corona charger. In contrast, in the second illustrative embodiment, a plurality of corona chargers 41 are connected to one charging-voltage output circuit 71. For example, as shown in FIG. 5, three corona chargers 41Y, 41M, and 41C are connected to the charging-voltage output circuit 71Y in parallel, and the wire voltage CHG2 is supplied from the charging-voltage output circuit 71Y to the corona chargers 41Y, 41M, and 41C. In this case, the printer 1 can be configured to have only two charging-voltage output circuits 71K and 71Y (the charging-voltage generating circuits 70K and 70Y). In the following description, components identical to those of the first illustrative embodiment described above are denoted by the same reference symbols, and a description thereof is appropriately omitted.

To the charging-voltage output circuit 71K for black, only the corona charger 41K configured to charge the photosensitive member 31K corresponding to black is connected. Therefore, for example, in the case of performing monochrome printing, the ASIC 61 can perform printing by driving only circuits and other components corresponding to black (the charging-voltage generating circuit 70K and the photosensitive member 31K). Since the number of circuits and other components which need to be driven decreases, it is possible to suppress power consumption and suppress wearing of the printer.

In the case of performing color printing, the ASIC 61 drives, for example, all of the charging-voltage generating circuits 70 and the photosensitive members 31, thereby performing printing. In this case, the ASIC 61 adjusts the wire voltage CHG2 by controlling the charging-voltage output circuit 71Y, for example, on the basis of a grid current Ig of three grid currents Ir2 to Ir4 having the smallest current value. For example, when toner or paper powder adheres to the charging wires 42, variations in increases of the current values of the grid currents Ir2 to Ir4 occur. For this reason, with reference to a grid current Ig having current value having increased the least, the ASIC controls the wire voltage CHG2. In this case, when there are variations in change amounts of the grid currents Ir2 to Ir4, it is possible to increase all of the current values of the grid currents Ir2 to Ir4 to target current values or larger values.

In this case where the corona chargers 41Y, 41M, and 41C is connected to one charging-voltage output circuit 71Y so as to share the charging-voltage output circuit 71Y, the load of a path for outputting the wire voltage CHG2 of the charging-voltage output circuit 71Y increases. In other words, the charging-voltage output circuit 71Y becomes a high-load output circuit having an output path having a higher load as compared to the charging-voltage output circuit 71K. In other words, the charging-voltage output circuit 71K becomes a low-load output circuit having an output path having a lower load as compared to the charging-voltage output circuit 71Y. The charging-voltage output circuit 71Y which is a high-load output circuit needs to apply a desired wire voltage CHG2 in response to an increase in the load, and needs to increase the output (power), for example, such that power is sufficient. For example, the charging-voltage output circuit 71Y of the second illustrative embodiment becomes a high-power charge output circuit having a larger output as compared to the charging-voltage output circuit 71K. In this case, due to the difference between the outputs of the charging-voltage output circuits 71K and 71Y, the corona charger 41K and the corona chargers 41Y, 41M, and 41C become different from each other in the aspect of abnormal discharge (such as the current value of an abnormal discharge current). Therefore, when one abnormal discharge detection circuit 72 is connected to the charging-voltage output circuits 71K and 71Y having different outputs, it may be impossible to accurately detect abnormal discharge occurring in each corona charger 41.

For this reason, in the second illustrative embodiment, the abnormal discharge detection circuits 72K and 72Y are connected to the charging-voltage output circuit 71Y and the charging-voltage output circuit 71K having different outputs (loads), respectively. According to this configuration, it is possible to change circuit constants and the like of the individual abnormal discharge detection circuits 72K and 72Y according to the aspects of abnormal discharge caused by the difference between the outputs or between loads, thereby adjusting the sensitivities and improving the accuracy of detection of abnormal discharge. For example, the sensitivity of the abnormal discharge detection circuit 72Y connected to the high-power charging-voltage output circuit 71Y is decreased. It can be considered to increase the sensitivity of the abnormal discharge detection circuit 72K connected to the low-power charging-voltage output circuit 71K. Alternatively, the sensitivity of only one of the abnormal discharge detection circuits 72K and 72Y may be adjusted. In the above-described example, three corona chargers 41Y, 41M, and 41C are connected to one charging-voltage output circuit 71Y; however, two, or four, or more corona chargers 41 may be connected.

In this connection, the charging-voltage output circuit 71Y is an example of a high-load output circuit. The charging-voltage output circuit 71K is an example of a low-load output circuit.

According to the second illustrative embodiment described above, the following effects are obtained.

(1) In the printer 1 of the second illustrative embodiment, the charging-voltage output circuits 71 (the charge output circuits) includes the charging-voltage output circuit 71Y (the high-load output circuit), and the charging-voltage output circuit 71K (the low-load output circuit) having a lower load of a path for outputting the wire voltage CHG (a charging voltage) than a load of a path of the charging-voltage output circuit 71Y for outputting the wire voltage CHG. The sensitivity of detecting the abnormal-discharge by the abnormal discharge detection circuit 72Y connected to the charging-voltage output circuit 71Y is lower than sensitivity of detecting the abnormal-discharge by the abnormal discharge detection circuit 72K connected to the charging-voltage output circuit 71K.

According to this configuration, the load of the path of the charging-voltage output circuit 71Y (the high-load output circuit) for outputting the wire voltage CHG2 (a charging voltage) is high, and the output of the charging-voltage output circuit 71Y (the high-load output circuit) is higher than that of the charging-voltage output circuit 71K (the low-load output circuit). For example, the load of an output path increases as the number of the corona chargers 41 which are connected by the output path increases, or as the length of the connection path between a corresponding charging-voltage output circuit 71 (a charge output circuit) and a corresponding corona charger 41 increases. In this case, for example, the sensitivity of the abnormal discharge detection circuit 72Y connected to the charging-voltage output circuit 71Y (the high-load output circuit) decreases as the output increases. The sensitivity of the abnormal discharge detection circuit 72K connected to the charging-voltage output circuit 71K (the low-load output circuit) increases as the output decreases. According to this configuration, it is possible to adjust the sensitivities according to the difference between the output capacities of the charging-voltage output circuits 71K and 71Y, and it is possible to accurately detect abnormal discharge.

(2) The abnormal discharge detection circuit 72Y connected to the charging-voltage output circuit 71Y (the high-load output circuit) has the same circuit configuration as the abnormal discharge detection circuit 72K connected to the charging-voltage output circuit 71K (the low-load output circuit) has. The circuit constants of the abnormal discharge detection circuits 72K and 72Y connected to the charging-voltage output circuits 71K and 71Y are set such that the sensitivity of the abnormal discharge detection circuit 72Y connected to the charging-voltage output circuit 71Y is lower than the sensitivity of the abnormal discharge detection circuit 72K connected to the charging-voltage output circuit 71K.

According to this configuration, the abnormal discharge detection circuit 72Y connected to the charging-voltage output circuit 71Y (the high-load output circuit) and the abnormal discharge detection circuit 72K connected to the charging-voltage output circuit 71K (the low-load output circuit) have the same circuit configuration. Meanwhile, the circuit constants of the abnormal discharge detection circuits 72K and 72Y are set such that the sensitivity of the abnormal discharge detection circuit 72Y connected to the charging-voltage output circuit 71Y is lower than the sensitivity of the abnormal discharge detection circuit 72K connected to the charging-voltage output circuit 71K. For example, the resistors 94 and 95 and the capacitor 96 of the abnormal discharge detection circuit 72K are changed, such that the transistor Tr1 is turned on by an abnormal discharge current having a smaller current value and the sensitivity for detecting abnormal discharge increases. According to this configuration, since the circuit configurations of the abnormal discharge detection circuits 72K and 72Y are standardized, it is possible to adjust the sensitivities of the charging-voltage output circuits 71K and 71Y according to the difference between their output capacities by changing the circuit constants while reducing the manufacturing cost.

(3) In the second illustrative embodiment, the number of the corona chargers 41 connected to the charging-voltage output circuit 71Y (the high-load output circuit) (in the present illustrative embodiment, three) is larger than the number of the corona chargers 41 connected to the charging-voltage output circuit 71K (the low-load output circuit) (in the present illustrative embodiment, one).

According to this configuration, for example, the charging-voltage output circuit 71Y (the high-load output circuit) is configured to be connected to more corona chargers 41 and have a higher output as compared to the charging-voltage output circuit 71K (the low-load output circuit). By adjusting the sensitivities according to the difference between the output capacities of the charging-voltage output circuits 71K and 71Y as described above, it is possible to adjust the difference between the sensitivities.

(4) Each of the corona chargers 41 includes a charging wire 42, and a grid 43 disposed between the corresponding photosensitive member 3 land the charging wire 42. The charging-voltage output circuit 71Y (the high-load output circuit) is connected to the charging wires 42Y, 42M, and 42C provided in the corona chargers 41Y, 41M, and 41C, and applies the wire voltage CHG2 (a charging voltage) to the charging wires 42Y, 42M, and 42C.

The charging-voltage output circuits (the charging-voltage output circuits 71) configured to apply the wire voltages CHG (charging voltages) to the charging wires 42 are required to have charging voltages having larger voltage values as compared to the charge output circuits (the grid voltage adjustment circuits 81) configured to apply the grid voltages GRID (charging voltages) to the grids 43. Therefore, in the case where the wire voltage CHG2 (a charging voltage) is applied from the high-load output circuit (the charging-voltage output circuit 71Y) to the charging wires 42Y, 42M, and 42C, the output difference between the charging-voltage output circuit 71Y (the high-load output circuit) and the charging-voltage output circuit 71K (the low-load output circuit) increases. For this reason, in the configuration in which the wire voltage CHG2 (a charging voltage) is applied from the high-load output circuit (the charging-voltage output circuit 71Y) to the charging wires 42Y, 42M, and 42C, it is very effective to adjust the sensitivities by changing the circuit constants and the like of the abnormal discharge detection circuits 72K and 72Y.

(5) The printer 1 includes the plurality of the photosensitive members 31. Each of the corona chargers 41 is provided corresponding to each of the photosensitive members 31. The photosensitive members 31 includes the photosensitive member 31K configured to carry toner (a developer) of black. The charging-voltage output circuit 71K (the low-load output circuit) is connected to charge the charging wire 42K of the corona charger 41K that charges the photosensitive member 31K configured to carry toner of black, and outputs the wire voltage CHG1 (a charging voltage).

In the second illustrative embodiment, the charging-voltage output circuit 71K (the low-load output circuit) configured to apply the wire voltage CHG1 to the corona charger 41K (the charging wire 42K) of black, and the charging-voltage output circuit 71Y (the high-load output circuit) connected to the corona chargers 41Y, 41M, and 41C (the charging wires 42Y, 42M, and 42C) of the other colors (yellow, magenta, and cyan) such that the corona chargers are connected in parallel and configured to apply the wire voltage CHG2 are separate circuits. According to this configuration, in the case of monochrome printing, only the charging-voltage output circuit 71K and the corona charger 41K corresponding to black are driven, and since the number of circuits which need to be driven decreases, it is possible to suppress power consumption and suppress wearing of the printer. According to this configuration, since the output difference between the high-load output circuit and the low-load output circuit becomes large, it is very effective to adjust the sensitivities by changing the circuit constants and the like of the abnormal discharge detection circuits 72.

Third Illustrative Embodiment

Now, the configuration of a third illustrative embodiment will be described. In the third illustrative embodiment, the voltage values of the DC power supplies Vcc1 of the individual abnormal discharge detection circuits 72 shown in FIG. 4 are set to different values. In the first illustrative embodiment, all of the voltages of the DC power supplies Vcc1 of the abnormal discharge detection circuits 72 are standardized with 5.0 V. In contrast, in the third illustrative embodiment, for example, the voltage value of the DC power supply Vcc1 of the abnormal discharge detection circuit 72K corresponding to black is set to 6.5 V. The voltage value of the DC power supply Vcc1 of the abnormal discharge detection circuit 72Y corresponding to yellow is set to 5.0 V. Further, the voltage value of the DC power supply Vcc1 of the abnormal discharge detection circuit 72M corresponding to magenta is set to 3.3 V. Furthermore, the voltage value of the DC power supply Vcc1 of the abnormal discharge detection circuit 72C corresponding to cyan is set to 1.7 V.

Moreover, for example, the circuit constants of the four abnormal discharge detection circuits 72 are set to the same value. In this case, when abnormal discharge currents having the same current value flow in the abnormal discharge detection circuits 72, the abnormal discharge detection circuits 72 output abnormal discharge detection signals Sv1 to Sv4 having different voltage values (signal levels) according to the voltage values of the DC power supplies Vcc1, respectively. Alternatively, the circuit constants of the abnormal discharge detection circuits 72 may be set to different values such that the individual abnormal discharge detection circuits 72 output abnormal discharge detection signals Sv1 to Sv4 having different voltage values (signal levels), respectively.

The ASIC 61 detects the signal level of each of the abnormal discharge detection signals Sv1 to Sv4 input from the port A/D1, thereby capable of specifying an abnormal discharge detection circuit 72 having output the corresponding abnormal discharge detection signal Sv, i.e. one of the corona chargers 41K to 41C in which abnormal discharge has occurred. For example, the ASIC 61 displays a printing color for which abnormal discharge has occurred, on a display unit (not shown in the drawings) of the printer 1. According to this configuration, when seeing the content of the display unit, the user can clean the charging wire 42 of the corona charger 41 in which abnormal discharge has occurred, thereby removing toner and paper powder, thereby capable of suppressing occurrence of abnormal discharge during the next printing.

According to the third illustrative embodiment described above, the following effects are obtained.

(1) The printer 1 of the third illustrative embodiment includes the plurality of photosensitive members 31. Each of the corona chargers 41 is provided corresponding to each of the photosensitive members 31. The abnormal discharge detection circuits 72 are connected to the different power supplies (the DC power supplies Vcc1), and outputs the abnormal discharge detection signals Sv1 to Sv4 having signal levels different from each another.

According to this configuration, the abnormal discharge detection circuits 72 are provided corresponding to each of the corona chargers 41 (the photosensitive members 31). The abnormal discharge detection circuits 72 are connected to the different DC power supplies Vcc1, and outputs the abnormal discharge detection signals Sv1 to Sv4 having the different signal levels (voltage values or current values) to the ASIC 61 (the controller). According to this configuration, on the basis of the signal level of an abnormal discharge detection signal Sv, the ASIC 61 can specify a corona charger 41 in which abnormal discharge has occurred. Therefore, for example, when information (such as a printing color) on a corona charger 41 in which abnormal discharge has occurred is notified to the user, the user can take an appropriate action such as cleaning the charging wire 42 of the corona charger 41 in which abnormal discharge has occurred.

Fourth Illustrative Embodiment

Figure 6:
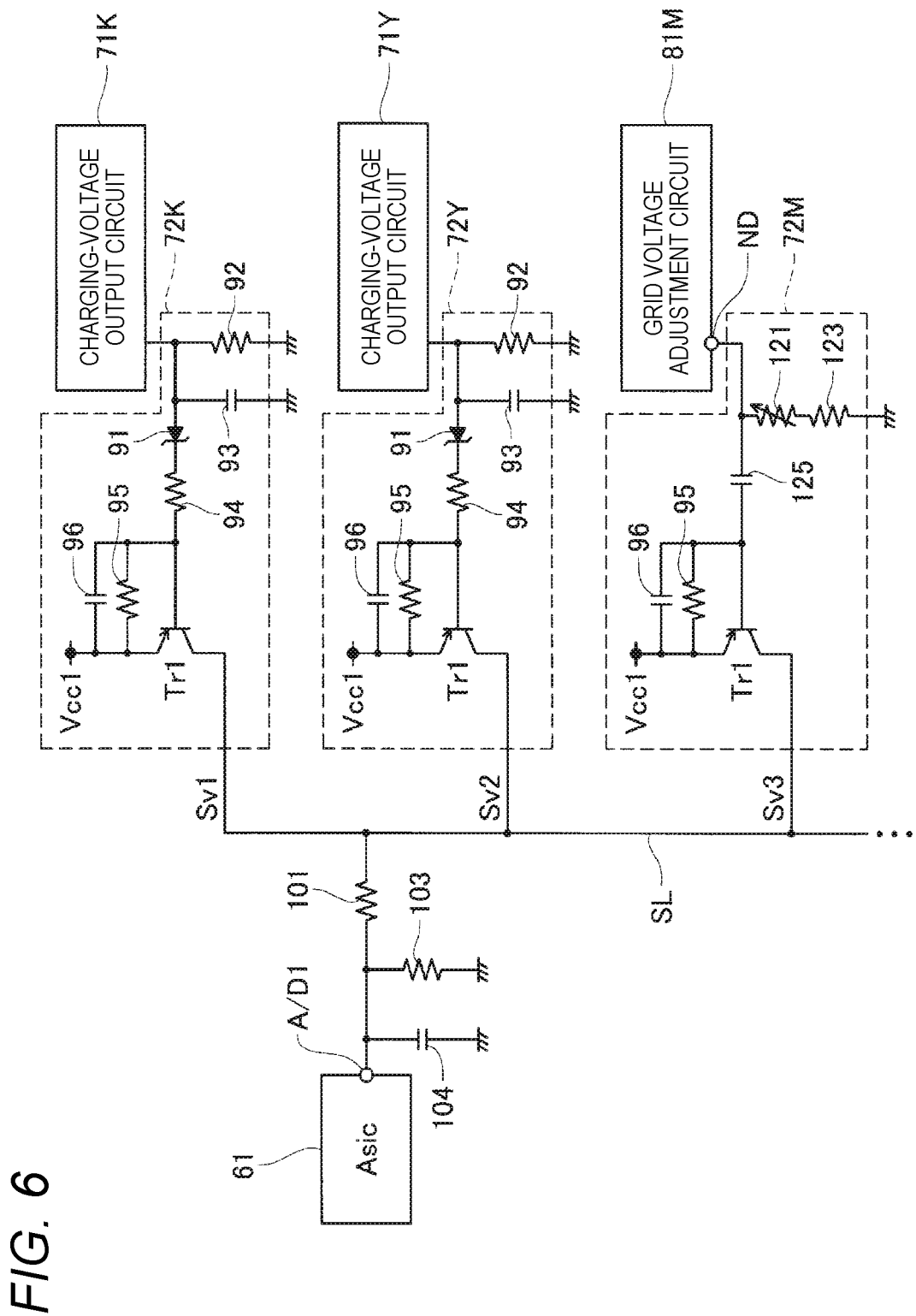
FIG. 6 is a circuit diagram illustrating the connection relation of an ASIC, abnormal discharge detection circuits, and charging-voltage generating circuits according to a fourth illustrative embodiment.

Now, the configuration of a fourth illustrative embodiment will be described with reference to FIG. 6. In the illustrative embodiments described above, the abnormal discharge detection circuits 72 are connected to the charging-voltage generating circuits 70, and are connected to the sides of the corona chargers 41 close to the charging wires 42. In this case, the charging-voltage generating circuits 70 become the charge output circuits of the present disclosure. In contrast, in the fourth illustrative embodiment, the abnormal discharge detection circuits 72 are connected to the sides close to the grids 43 (the grid voltage adjustment circuits 81). As an example, the case where the abnormal discharge detection circuit 72M is connected to the grid voltage control circuit 81M corresponding to magenta as shown in FIG. 6 will be described. In the following description, components identical to those of the illustrative embodiments described above are denoted by the same reference symbols, and a description thereof is appropriately omitted. The configuration shown in FIG. 6 is an example, and, for example, all of the four abnormal discharge detection circuits 72 may be connected to the sides close to the grids 43 (the grid voltage adjustment circuits 81).

The abnormal discharge detection circuit 72M of the fourth illustrative embodiment is connected to a node ND of the grid voltage control circuit 81M. The node ND is, for example, the connection point of the transistor Q1 and the grid 43M as shown in FIG. 2. The grid 43M outputs a current toward the node ND, according to a voltage generated during corona discharge or abnormal discharge. As shown in FIG. 6, between the node ND and the ground, a variable resistor 121 and a detection resistor 123 are connected in series. The variable resistor 121 and the detection resistor 123 are for adjusting the voltage on the node ND such that the grid voltage GRID3 generated in the grid 43M becomes a predetermined voltage. The voltage on the node ND can be changed by adjusting the resistance value of the variable resistor 121. The connection point of the node ND and the variable resistor 121 is connected to the transistor Tr1 via a capacitor 125.

Normally, the capacitor 125 shuts off a current from the node ND to the base of the transistor Tr1. According to this configuration, the abnormal discharge detection circuit 72M can suppress the transistor Tr1 from being turned on in the case where a current supplied to the node ND includes noise, thereby suppressing erroneous detection of abnormal discharge. The capacitor 125 flows an abnormal discharge current suddenly increasing during occurrence of abnormal discharge from the node ND toward the transistor Tr1. The capacitor 125 takes an AC component from the abnormal discharge current, and applies the AC component to the transistor Tr1.

In each abnormal discharge detection circuit 72 of the first illustrative embodiment, the zener diode 91 is connected to the base of the transistor Tr1. In each charging-voltage generating circuit 70, not only during occurrence of abnormal discharge, but also after that time, a voltage larger than that a voltage which is normally applied may be applied to the corresponding abnormal discharge detection circuit 72. For this reason, the zener diode 91 is used. According to this configuration, it is possible to protect the circuits of each abnormal discharge detection circuit 72 even though a high voltage is applied after occurrence of abnormal discharge.

Meanwhile, in each grid voltage adjustment circuit 81, only during abnormal discharge, a large current is likely to be generated. Therefore, in protecting the circuit after abnormal discharge, a zener diode 91 is not necessarily needed. For this reason, in the case of connecting an abnormal discharge detection circuit 72 to a grid voltage adjustment circuits 81, instead of the zener diode 91, the capacitor 125 is connected to the base of the transistor Tr1, whereby it is possible to reduce the manufacturing cost.

In the abnormal discharge detection circuit 72M having the above-described configuration, similarly to the abnormal discharge detection circuit 72M of the first illustrative embodiment, when abnormal discharge occurs in a corresponding corona charger 41, an abnormal discharge current flows in the grid 43M, and thus the transistor Tr1 is turned on. When the abnormal discharge detection signal Sv3 is input from the transistor Tr1 of the abnormal discharge detection circuit 72M, the ASIC 61 can detect occurrence of abnormal discharge.

According to the fourth illustrative embodiment described above, the following effects are obtained.

(1) In the printer 1 of the fourth illustrative embodiment, each of the corona chargers 41 includes a charging wire 42, and a grid 43 disposed between the charging wire 42 and a corresponding photosensitive member 31. At least one (the grid voltage control circuit 81M) of the charge output circuits (the charging-voltage generating circuits 70 and the grid voltage adjustment circuits 81) is connected to the grids 43 provided in each of the corona chargers 41, and applies the grid voltage GRID3 (a charging voltage) to the grid 43M.

According to this configuration, the abnormal discharge detection circuit 72M is connected to the grid 43, thereby capable of detecting abnormal discharge. Further, it is possible to accurately detect abnormal discharge by adjusting the sensitivity of the abnormal discharge detection circuit 72M connected to the grid 43M.

However, it is obvious that the present disclosure is not limited to the illustrative embodiments described above and can be modified and changed without departing from the scope of the present disclosure.

Figure 7:
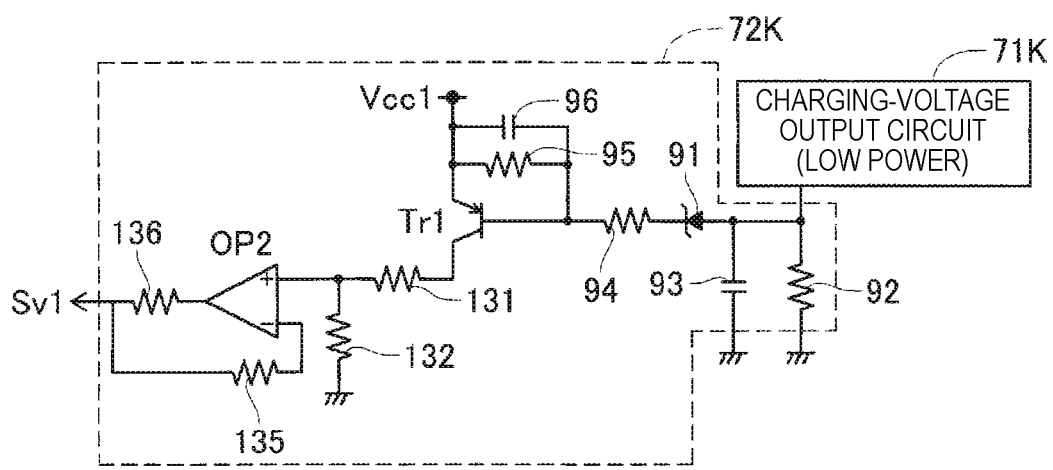
FIG. 7 is a circuit diagram illustrating the other example of the abnormal discharge detection circuit including an operational amplifier.

For example, the configurations of the abnormal discharge detection circuits 72 of each illustrative embodiment described above are examples, and can be appropriately changed. For example, as shown in FIG. 7, at the output part of the abnormal discharge detection circuit 72K, an operational amplifier OP2 (an amplifier circuit) for amplifying the abnormal discharge detection signal Sv1 may be provided. In the following description, components identical to those of the illustrative embodiments described above are denoted by the same reference symbols, and a description thereof is appropriately omitted.

As shown in FIG. 7, the non-inversion input terminal of the operational amplifier OP2 is connected to the collector of the transistor Tr1 via a resistor 131. The non-inversion input terminal of the operational amplifier OP2 is connected to the ground via a resistor 132. Further, the output terminal of the operational amplifier OP2 is connected to the non-inversion input terminal via resistors 135 and 136. The operational amplifier OP2 amplifies the abnormal discharge detection signal Sv1 input to the non-inversion input terminal, and outputs the amplified signal to the ASIC 61 (see FIG. 4).

For example, in the case where it is impossible to adjust the sensitivity of an abnormal discharge detection circuit 72 having the circuit configuration shown in FIG. 4 only by changing the circuit constants, it is effective to connect an operational amplifier OP2. Specifically, it can be considered the case where the abnormal discharge detection circuit 72K and the ASIC 61 are placed apart from each other according to the layout of circuits and the line length of the common signal line SL (see FIG. 4) for transmitting the abnormal discharge detection signal Sv1 is long. In this case, the attenuation rate of an abnormal discharge detection signal Sv during transmission in the common signal line SL increases. As a result, the sensitivity of the abnormal discharge detection circuit 72K may decrease. In this case, when an operational amplifier OP2 is connected so as to amplify the abnormal discharge detection signal Sv1, thereby increasing the sensitivity, it is possible to adjust the signal level of the abnormal discharge detection signal Sv1.

As shown in FIG. 7, it can be considered to provide an operational amplifier OP2 to the abnormal discharge detection circuit 72K of the low-power charging-voltage output circuit 71K described with reference to FIG. 5 (the second illustrative embodiment). In other words, an operational amplifier OP2 (an amplifier circuit) for amplifying the abnormal discharge detection signal Sv1 may be connected to the abnormal discharge detection circuit 72K connected to the charging-voltage output circuit 71K (the low-load output circuit).

According to this configuration, for example, in the case where the output difference between the high-load output circuit and the low-load output circuit is large, and thus it is impossible to adjust the sensitivities by changing the circuit constants, the abnormal discharge detection signal Sv1 output from the abnormal discharge detection circuit 72K (the low-load output circuit) is amplified, whereby it is possible to improve the sensitivity and adjust the sensitivity difference.

Figure 8:
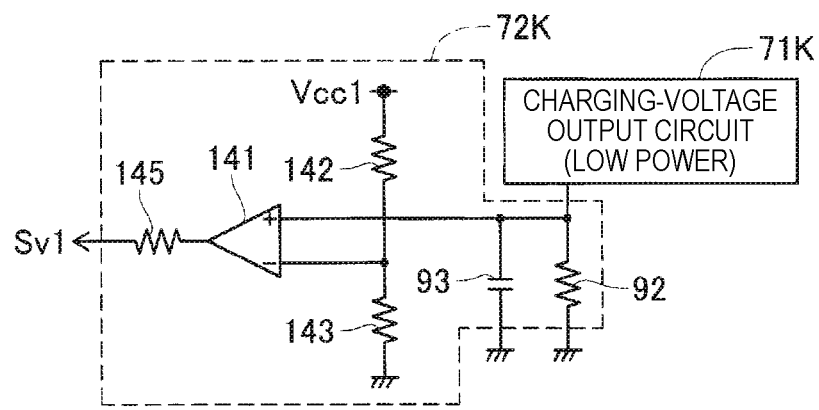
FIG. 8 is a circuit diagram illustrating the other example of the abnormal discharge detection circuit including a comparator.

For example, as shown in FIG. 8, a comparator 141 (an example of a comparison circuit) may be provided in the abnormal discharge detection circuit 72K of the low-power charging-voltage output circuit 71K, thereby adjusting the sensitivity. As shown in FIG. 8, to the non-inversion input terminal of the comparator 141, the positive terminal of the capacitor 93, the positive terminal of the detection resistor 92, and the charging-voltage output circuit 71K (the low-voltage-side output terminal T2 of FIG. 3) are connected. To the inversion input terminal of the comparator 141, a reference voltage obtained by dividing the voltage of the DC power supply Vcc1 by voltage division resistors 142 and 143 is input. To the output terminal of the comparator 141, an output resistor 145 is connected. The comparator 141 compares the voltage input to the non-inversion input terminal (the voltage caused by abnormal discharge) and the reference voltage, and outputs the comparison result as the abnormal discharge detection signal Sv1 to the ASIC 61.

In the configuration shown in FIG. 8, the abnormal discharge detection circuit 72K connected to the charging-voltage output circuit 71K (the low-load output circuit) includes the comparator 141 configured to compare the voltage caused by abnormal discharge with the reference voltage and output the abnormal discharge detection signal Sv1. According to this configuration, for example, by decreasing the voltage value of the reference voltage of the comparator 141, it is possible to increase the sensitivity for detecting abnormal discharge, and adjust the sensitivity difference. For example, by increasing the voltage value of the reference voltage of the comparator 141, it is possible to decrease the sensitivity for detecting abnormal discharge. Further, in the abnormal discharge detection circuit 72K having the comparator 141 shown in FIG. 8, the necessity for the transistor Tr1 shown in FIG. 7 is eliminated.

In the examples shown in FIG. 7 and FIG. 8, the operational amplifier OP2 or the comparator 141 is connected to the low-power charging-voltage output circuit 71K (the abnormal discharge detection circuit 72K); however, the present disclosure is not limited thereto. For example, an operational amplifier OP2 or the like may be provided in each abnormal discharge detection circuit 72 shown in FIG. 4. An operational amplifier OP2 or the like may be provided in the high-power charging-voltage output circuit 71Y (the abnormal discharge detection circuit 72Y) shown in FIG. 5. An operational amplifier OP2 or the like may be provided in the grid voltage control circuit 81M (the abnormal discharge detection circuit 72M close to the grid 43M) shown in FIG. 6.

In each illustrative embodiment described above, the case where one corona charger 41 corresponds to one photosensitive member 31 has been described as an example. However, the present disclosure is not limited thereto. The present disclosure can be applied to a configuration in which the plurality of corona chargers 41 corresponds to one photosensitive member 31, for example, a printer (an image forming apparatus) for superimposing toner images of individual colors on one photosensitive member 31 and transferring them on a sheet P at once. In this case, the number of photosensitive members 31 may be one.

The printer 1 may be a monochrome printer having only a photosensitive member 31K corresponding to black.

The high-voltage power supply circuit 62 may have a configuration having not only abnormal discharge detection circuits 72 connected on the sides close to the charging wires 42 but also abnormal discharge detection circuits 72 connected on the sides close to the grids 43. In this case, the charge output circuits of the present disclosure correspond not only to the charging-voltage output circuits 71 but also to the grid voltage adjustment circuits 81.

On both sides of one corona charger 41, i.e. the side close to a charging wire 42 and the side close to a grid 43, abnormal discharge detection circuits 72 may be provided, respectively. In this case, the ASIC 61 may determine whether abnormal discharge has occurred by comparing detection results of the abnormal discharge detection circuits 72 provided on both sides, i.e. the side close to the charging wire 42 and the side close to the grid 43.

In each illustrative embodiment described above, as examples of photosensitive members, the drum-shaped photosensitive members 31 have been taken. However, the photosensitive members are not limited thereto, and may be, for example, belt-shaped photosensitive members.

As corona chargers of the present disclosure, the scorotron type corona chargers 41 having the grids 43 are used; however, the present disclosure is not limited thereto. The corona chargers of the present disclosure may be corotron type corona chargers having no grids 43.

In each illustrative embodiment described above, as the controller, the ASIC 61 is used. However, the controller of the present disclosure is not limited to the case where it is configured with dedicated hardware such as the ASIC 61, and may be configured with, for example, software executable on a CPU. The controller may be an ASIC having a CPU mounted thereon.

In each illustrative embodiment described above, as the image forming apparatus of the present disclosure, the electrophotographic laser printer 1 is used; however, the present disclosure is not limited thereto. The image forming apparatus of the present disclosure may be any other apparatus such as a multi-function apparatus, a facsimile machine, or a copy machine.

What is claimed is:

1. An image forming apparatus comprising:
   a plurality of photosensitive members;
   a plurality of corona chargers configured to charge the plurality of photosensitive members by corona discharge, each of the corona chargers including a charging wire and a grid which is disposed between one of the plurality of photosensitive members and the charging wire;
   a plurality of charge output circuits connected to a plurality of the charging wires and configured to output a wire voltage, which is applied to each of the charging wires;
   a plurality of abnormal discharge detection circuits configured to output an abnormal discharge detection signal according to abnormal discharge occurring in each of the corona chargers; and
   a controller configured to have a common input port connected to the abnormal discharge detection circuits wherein the abnormal discharge detection signal output from each of the abnormal discharge detection circuits is input to the controller through the common input port,
   wherein each of the abnormal discharge detection circuits is connected to a corresponding one of the charge output circuits connected to the charging wires.

2. The image forming apparatus according to claim 1,
   wherein the plurality of charge output circuits includes a first charge output circuit having a high-load of a path for outputting the wire voltage, and a second charge output circuit having a lower load than the high-load of the path for outputting the wire voltage, and
   wherein a sensitivity of detecting abnormal discharge by a first abnormal discharge detection circuit connected to the first charge output circuit is lower than a sensitivity of detecting abnormal discharge by a second abnormal discharge detection circuit connected to the second charge output circuit.

3. The image forming apparatus according to claim 2,
   wherein the first abnormal discharge detection circuit connected to the first charge output circuit has the same circuit configuration as the second abnormal discharge detection circuit connected to the second charge output circuit, and
   wherein circuit constants of the first and second abnormal discharge detection circuits are set such that the sensitivity of the first abnormal discharge detection circuit is lower than the sensitivity of the second abnormal discharge detection circuit.

4. The image forming apparatus according to claim 2,
   wherein the second abnormal discharge detection circuit includes at least one circuit of an amplifier circuit configured to amplify the abnormal discharge detection signal and a comparison circuit configured to compare a voltage caused by the abnormal discharge and a reference voltage to output the abnormal discharge detection signal.

5. The image forming apparatus according to claim 2,
   wherein a number of the corona chargers connected to the first charge output circuit is larger than the number of the corona chargers connected to the second charge output circuit.

6. The image forming apparatus according to claim 2,
   wherein each of the corona chargers is provided corresponding to each of the photosensitive members,
   wherein the photosensitive members include a photosensitive member configured to carry a developer of black, and
   wherein the second charge output circuit is connected to the charging wire of the corona charger that charges the photosensitive member configured to carry the developer of black, and
   outputs the wire voltage.

7. The image forming apparatus according to claim 2,
   wherein each of the corona chargers is provided corresponding to each of the photosensitive members, and
   wherein the first and second abnormal discharge detection circuits are connected to different power supplies, and outputs the abnormal discharge detection signals having signal levels different from each other.

\* \* \* \* \*